United States Patent
DeRose

(10) Patent No.: US 9,115,882 B2
(45) Date of Patent: Aug. 25, 2015

(54) FLUID COOLED LIGHTING ELEMENT

(76) Inventor: Anthony DeRose, Caledon East (CA)

(*) Notice: Subject to any disclaimer, the term of this patent is extended or adjusted under 35 U.S.C. 154(b) by 405 days.

(21) Appl. No.: 13/600,876

(22) Filed: Aug. 31, 2012

(65) Prior Publication Data

US 2013/0058100 A1    Mar. 7, 2013

Related U.S. Application Data

(60) Provisional application No. 61/530,347, filed on Sep. 1, 2011.

(51) Int. Cl.

| | |
|---|---|
| *F21V 29/00* | (2006.01) |
| *H05K 1/18* | (2006.01) |
| *F21V 29/58* | (2015.01) |
| *F21S 9/04* | (2006.01) |
| *H05K 3/00* | (2006.01) |
| *F21Y 101/02* | (2006.01) |
| *F21K 99/00* | (2010.01) |
| *F21V 19/00* | (2006.01) |
| *F21V 23/04* | (2006.01) |
| *H01L 25/075* | (2006.01) |
| *H01L 33/64* | (2010.01) |
| *F21Y 105/00* | (2006.01) |

(52) U.S. Cl.
CPC ............ *F21V 29/30* (2013.01); *F21V 29/58* (2013.01); *H05K 1/181* (2013.01); *F21K 9/00* (2013.01); *F21S 9/046* (2013.01); *F21V 19/0055* (2013.01); *F21V 23/0435* (2013.01); *F21Y 2101/02* (2013.01); *F21Y 2105/001* (2013.01); *H01L 25/0753* (2013.01); *H01L 33/648* (2013.01); *H01L 2924/0002* (2013.01); *H05K 3/0058* (2013.01); *H05K 2201/09027* (2013.01); *H05K 2201/10106* (2013.01); *Y10T 29/49144* (2015.01); *Y10T 29/49146* (2015.01)

(58) Field of Classification Search
CPC ..... F21V 29/30; F21V 29/58; F21V 19/0055; F21V 23/0435; Y10T 29/49146; Y10T 29/49144; F21Y 2101/02; F21Y 2105/001; F21K 9/00; H01L 25/0753; H01L 33/648; H01L 2924/00; H05K 3/0058; H05K 2201/09027; H05K 2201/10106; H05K 1/181; F21S 9/046

See application file for complete search history.

(56) References Cited

U.S. PATENT DOCUMENTS

| | | | |
|---|---|---|---|
| 2005/0110395 A1* | 5/2005 | Nagata et al. | 313/498 |
| 2008/0170367 A1 | 7/2008 | Lai | |
| 2009/0059594 A1 | 3/2009 | Lin | |
| 2010/0177519 A1 | 7/2010 | Schlitz | |

FOREIGN PATENT DOCUMENTS

EP          2036734      3/2009

\* cited by examiner

*Primary Examiner* — Thomas M Sember

(74) *Attorney, Agent, or Firm* — Todd J. Langford; Eric A. Hanscom

(57) ABSTRACT

A fluid cooled light emitting diode and associated lighting unit is disclosed. A fluid, preferably a liquid, cools and stabilizes the p-n junction of the light emitting diode thereby reducing the energy required to power the light emitting diode, lengthening its usable lifetime, and outputting more consistent light. The fluid cools the lens surrounding the light emitting diode, a printed circuit board on which the light emitting diode resides, or other heat transferring elements proximate to the lens of the light emitting diode.

12 Claims, 4 Drawing Sheets

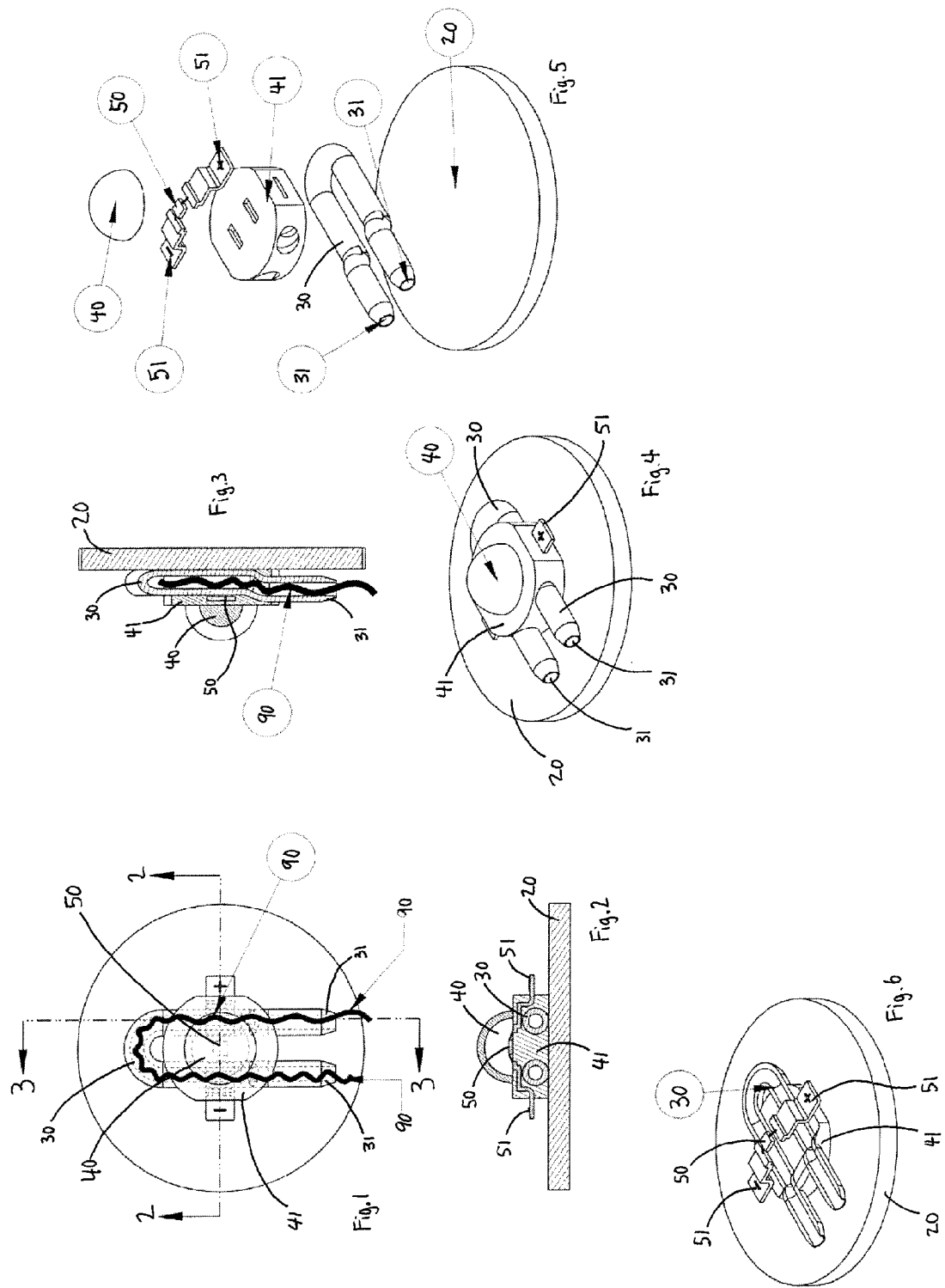

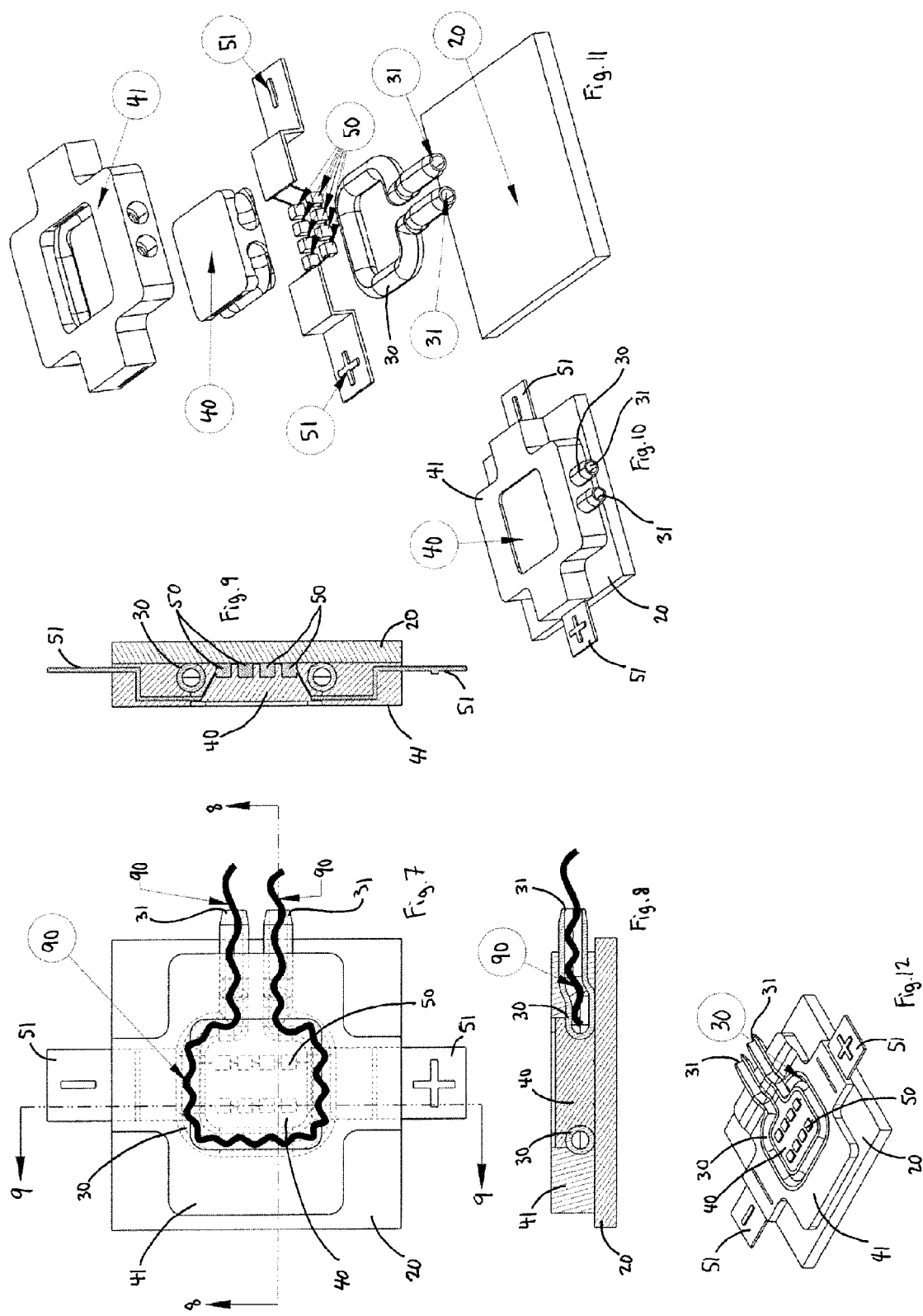

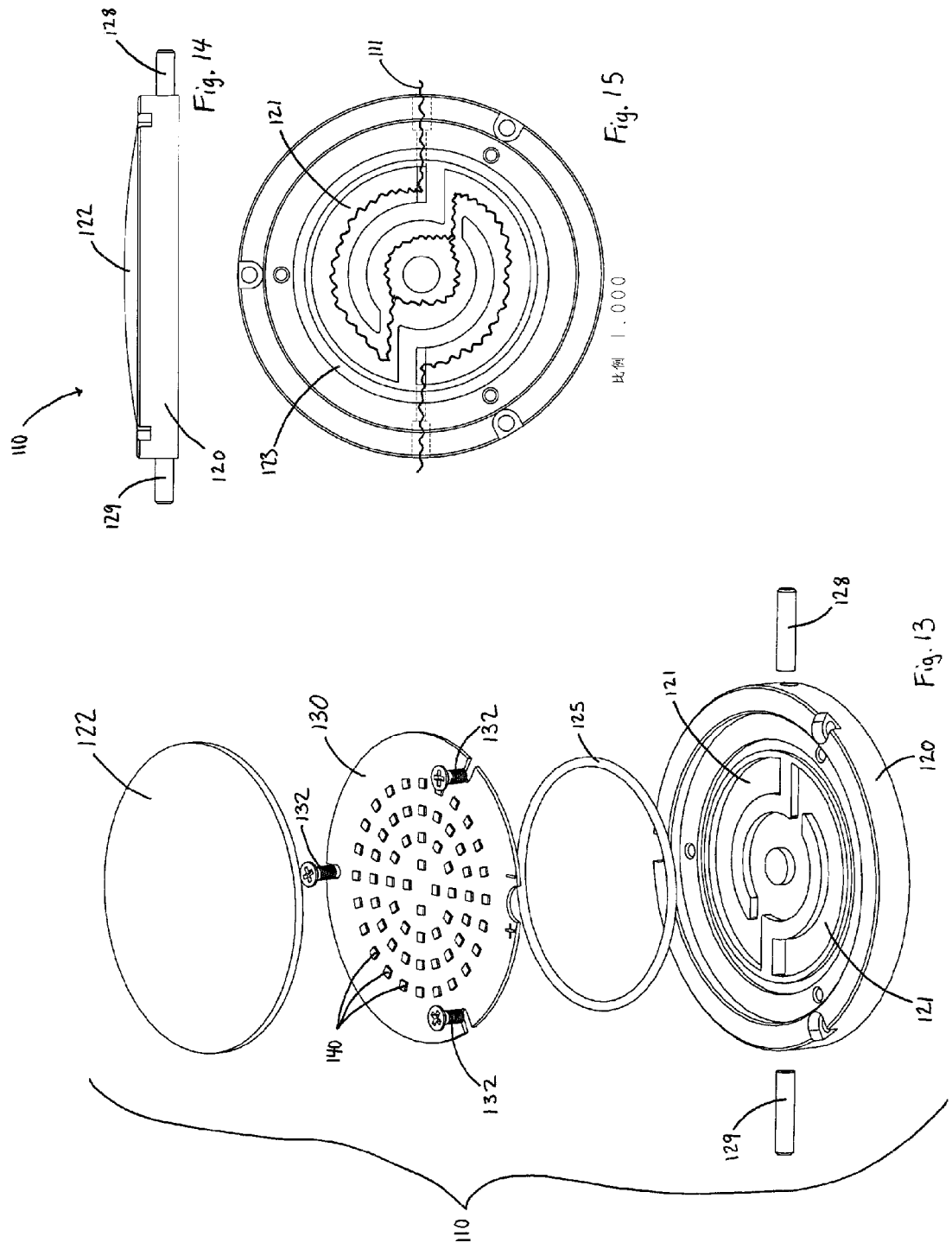

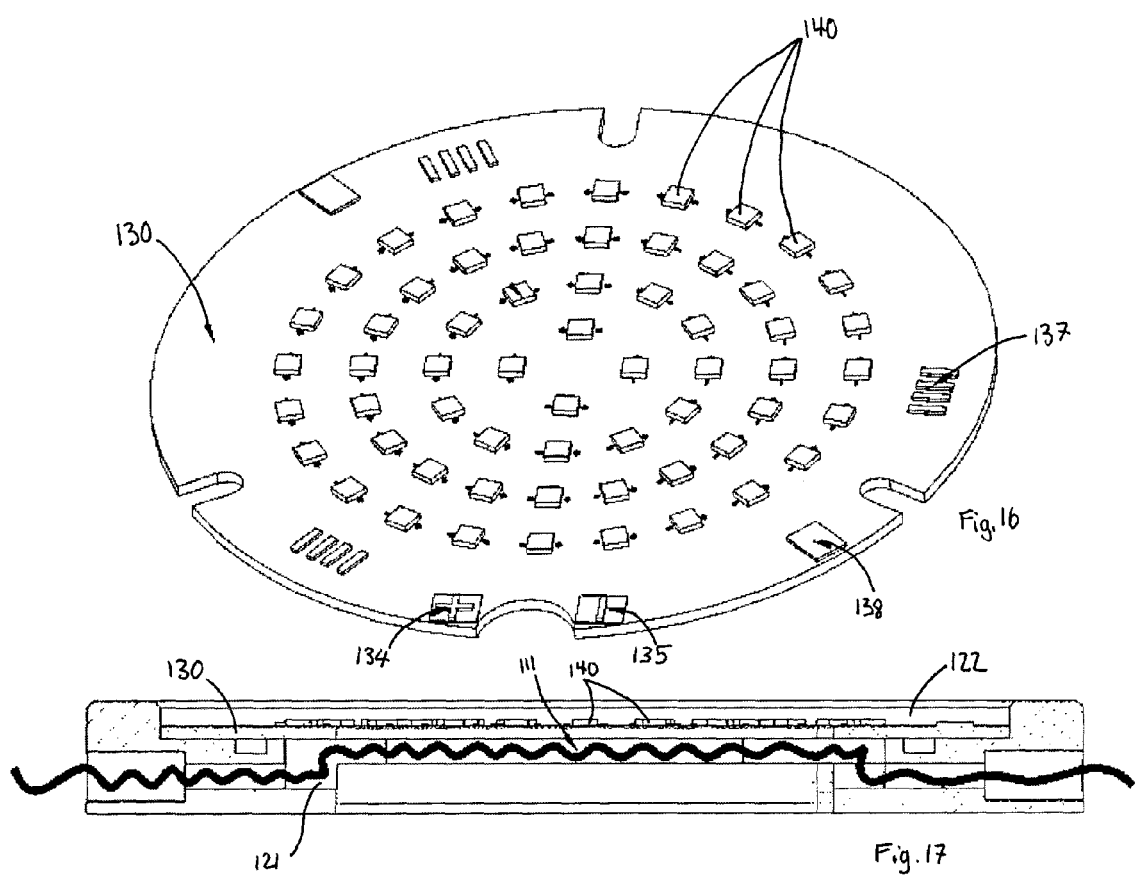

FLUID COOLED LIGHTING ELEMENT

CROSS REFERENCE TO RELATED APPLICATIONS

This application claims the benefit of U.S. Provisional Patent App. No. 61/540,347 filed on Sep. 1, 2011, the entirety of which is hereby incorporated by reference.

STATEMENT REGARDING FEDERALLY SPONSORED RESEARCH OR DEVELOPMENT

This invention was not federally sponsored.

BACKGROUND OF THE INVENTION

Field of the Invention

This invention relates to the general field of light emitting diodes, and more specifically toward fluid cooled light emitting diodes. A fluid, preferably a liquid, cools and stabilizes the p-n junction of the light emitting diode thereby reducing the energy required to power the light emitting diode, lengthening its usable lifetime, and outputting more consistent light. The fluid can cool the lens surrounding the light emitting diode, other heat transferring elements proximate to the lens of the light emitting diode, or a printed circuit board to which one or more light emitted diodes are secured.

A light emitting diode, or LED, is preferable over a florescent or incandescent light bulb. LEDs require less power to produce the same amount of light as florescent or incandescent light bulbs. Further, LED lights have extremely long life spans, and do not contain mercury. LEDs are prime candidates for many applications requiring sources of light.

An LED is a light-producing object that produces light by passing electricity through a p-n junction biased in the forward direction. A plastic lens surrounds the diode to protect it. The light leaves the diode and travels through the plastic lens where it exits the LED light bulb. The process of creating light from the diode also produces heat.

High lumen LEDs, also known as high power LEDs, are light emitting diodes that can produce upwards of 100 lumens/watt or more. These high lumen LEDs also require more current to run, needing as much as 380 mA for a single 1 watt LED. Some multi-chip LEDs require 3 A or more to run the module.

The amount of heat produced by the LED increases as the current running through the LED increases. The temperature of the p-n junction has a significant effect on the light output of the LED, especially at higher temperatures. Higher temperatures require more current to produce the same output of light. Of course, as more current flows through the LED, even more heat is generated thus continuing to raise the temperature and requiring even more current. Damage to the LED can occur if the temperature of the p-n junction exceeds sixty degrees centigrade (60° C.). Thus, it is imperative to maintain the temperature of the p-n junction of an LED below 60° C.

Heat sinks have been employed to maintain stable temperatures within an LED. These heat sinks are generally extruded metal with fins that transfer heat from the LED to a surrounding medium. They can be large and bulky. Heat sinks cannot be encapsulated because the heat must be released to an external medium, usually air. Since heat rises, a heat sink cannot be located below the LED, as the heat emitted from the heat sink would fall incident to the LED once again. Therefore, the heat sink is preferably located above the LED, thereby limiting the orientation of physical locations in which LEDs can be used, especially high lumen LEDs.

When multiple LEDs are placed in close proximity to each other on a printed circuit board (PC board), heat can build up even faster. Larger heat sinks may be incorporated into the design; however, there is generally a limit on the size of the heat sinks and the amount of heat that can be dissipated by means of the heat sink. This limits the density of LEDs.

Thus there has existed a long-felt need for light emitting diodes, particularly high lumen light emitting diodes, that emit light at a high lumen to watt ratio while maintaining a p-n junction temperature of below 60° C.

SUMMARY OF THE INVENTION

The current invention provides just such a solution by disclosing a fluid cooled light emitting diode. A fluid, preferably a liquid, cools and stabilizes the p-n junction of the light emitting diode thereby reducing the energy required to power the light emitting diode, lengthening its usable lifetime, and outputting more consistent light. The fluid cools the lens surrounding the light emitting diode or other heat transferring elements proximate to the lens of the light emitting diode.

While the fluid cools the light emitting diode, it can simultaneously perform other functions. Fluid that has been heated by the LED can be transferred to another location to dissipate the heat it contains. For example, LEDs used to light the exterior of a building or complex can transfer heat to a liquid flowing therethrough, where the liquid then flows to the building and subsequently is used to heat the building.

The fluid can also be used to power the LED. Fluid under pressure can be used to turn a turbine integrated into the pipe that supplies the fluid to the LED. The fluid flows through a turbine, which creates an electrical current that powers the LED. The heat created by the LED is also transferred to the fluid as it passes therethrough. This has particular advantages where there is an ample supply of a fluid already under pressure, such as near dams, rivers, and ocean currents.

Raw LEDs may also be affixed directly to a printed circuit board, where fluid is directed such that it comes in contact with the back side of the printed circuit board. Resistors and current controls are also affixed to the printed circuit board, which itself is secured into a cavity in the housing. Silicon or epoxy is then injected into the cavity to cover and seal the printed circuit board, LEDs, and other electronic components.

It is a principal object of the invention to provide a means for cooling the p-n junction of a light emitting diode.

It is another object of the invention to provide a means for stabilizing the temperature of the p-n junction of a light emitting diode.

It is a further object of this invention to provide a means for powering a light emitting diode using a fluid flowing through or around the light emitting diode.

In a particular embodiment, the invention is a device comprising a mount plate, a printed circuit board, and a lens, where the mount plate comprises a channel extending therethrough, where the printed circuit board comprises a raw light emitting diode, where the printed circuit board is secured to the mount plate thereby enclosing the channel of the mount plate, where the lens covers the printed circuit board, whereby fluid travelling through the channel comes in contact with the printed circuit board, whereby heat emitted from the raw light emitting diode is transferred to the printed circuit board and then to the fluid travelling through the channel.

In another embodiment, the invention is a device comprising a mount plate, a printed circuit board, and a lens, where the mount plate comprises a channel extending therethrough, where the printed circuit board comprises a raw light emitting diode, where the printed circuit board is secured to the mount plate thereby enclosing the channel of the mount plate, where the lens covers the printed circuit board, whereby fluid travelling through the channel comes in contact with the printed circuit board, whereby heat emitted from the raw light emitting diode is transferred to the printed circuit board and then to the fluid travelling through the channel further comprising a seal, where the mount plate further comprises a groove, where the seal resides within the groove, whereby the seal creates a fluid tight seal between the printed circuit board and the mount plate, wherein the mount plate further comprises an inlet and an outlet, whereby fluid is supplied to the channel in the mount plate via the inlet, whereby fluid exits the mount plate via the outlet, wherein the printed circuit board further comprises one or more electrical components selected from the group consisting of resistors, current controls, and integrated circuits, wherein the printed circuit board further comprises a positive terminal and a negative terminal, whereby power is supplied to the printed circuit board through the positive and negative terminal, wherein the device further comprises a plurality of screws, wherein the screws secure the printed circuit board to the mount plate, wherein the lens is made from a material selected from the group consisting of epoxy and silicon, wherein the printed circuit board further comprises a plurality of additional raw light emitting diodes.

In an additional embodiment, the invention is a method of operating a light emitting diode comprising the steps of obtaining a lighting unit, where the lighting unit comprises a mount plate, a printed circuit board, a lens, and a light emitting diode, where the mount plate comprises a channel extending therethrough, an inlet, and an outlet, where the inlet and outlet of the mount plate are in fluid connection with the channel of the mount plate, where the printed circuit board comprises positive and negative terminals, where the light emitting diode is secured to and in electrical connection with the printed circuit board, where the printed circuit board is secured to the mount plate thereby enclosing the channel of the mount plate, where the lens covers the printed circuit board and light emitting diode; providing power to the positive and negative terminals of the printed circuit board to a power source, whereby power from the power source drives the light emitting diode causing it to emit light; and providing fluid to the inlet of the mount plate, whereby fluid flows through the channel of the mount plate and comes in contact with the printed circuit board, whereby heat emitted from the raw light emitting diode is transferred to the printed circuit board and then to the fluid travelling through the channel, whereby fluid exits through the outlet of the mount plate.

In yet another embodiment, the invention is a method of manufacturing a lighting unit comprising the steps of forming a mount plate, where the mount plate comprises a channel extending therethrough; bonding a light emitting diode chip to a printed circuit board; securing the printed circuit board to the mount plate, whereby the channel of the mount plate is enclosed by the printed circuit board; and injecting a liquid resin over the printed circuit board to form a lens.

In a further embodiment, the invention is a method of manufacturing a lighting unit comprising the steps of forming a mount plate, where the mount plate comprises a channel extending therethrough; bonding a light emitting diode chip to a printed circuit board; bonding the light emitting diode chip onto the positive location and the negative location of the printed circuit board, bonding an integrated circuit to the printed circuit board, bonding one or more additional light emitting diode chips to the printed circuit board, securing the printed circuit board to the mount plate, whereby the channel of the mount plate is enclosed by the printed circuit board; and injecting a liquid resin over the printed circuit board to form a lens, where the mount plate further comprises side walls, where the side walls of the mount plate extend above a printed circuit board secured to the mount plate, wherein the step of securing the printed circuit board to the mount plate includes placing a seal between the mount plate and the printed circuit board and securing the printed circuit board to the mount plate using a plurality of screws.

There has thus been outlined, rather broadly, the more important features of the invention in order that the detailed description thereof may be better understood, and in order that the present contribution to the art may be better appreciated. There are additional features of the invention that will be described hereinafter and which will form the subject matter of the claims appended hereto. The features listed herein and other features, aspects and advantages of the present invention will become better understood with reference to the following description and appended claims.

BRIEF DESCRIPTION OF THE FIGURES

The accompanying drawings, which are incorporated in and form a part of this specification, illustrate embodiments of the invention and together with the description, serve to explain the principles of this invention.

FIG. 1 is a top schematic view of a single-chip fluid-cooled LED unit according to selected embodiments of the current disclosure.

FIG. 2 is a cutaway front view of a single-chip fluid-cooled LED unit according to selected embodiments of the current disclosure.

FIG. 3 is a cutaway side view of a single-chip fluid-cooled LED unit according to selected embodiments of the current disclosure.

FIG. 4 is a top perspective view of a single-chip fluid-cooled LED unit according to selected embodiments of the current disclosure.

FIG. 5 is an exploded view of a single-chip fluid-cooled LED unit according to selected embodiments of the current disclosure.

FIG. 6 is a partial cutaway top view of a single-chip fluid-cooled LED unit according to selected embodiments of the current disclosure.

FIG. 7 is a top schematic view of a multi-chip fluid-cooled LED unit according to selected embodiments of the current disclosure.

FIG. 8 is a cutaway side view of a multi-chip fluid-cooled LED unit according to selected embodiments of the current disclosure.

FIG. 9 is a front view of a multi-chip fluid-cooled LED unit according to selected embodiments of the current disclosure.

FIG. 10 is a top perspective view of a multi-chip fluid-cooled LED unit according to selected embodiments of the current disclosure.

FIG. 11 is an exploded view of a multi-chip fluid-cooled LED unit according to selected embodiments of the current disclosure.

FIG. 12 is a partial cutaway top view of a multi-chip fluid-cooled LED unit according to selected embodiments of the current disclosure.

FIG. 13 is an exploded view of a printed circuit board LED unit according to selected embodiments of the current disclosure.

FIG. 14 is a side view of a printed circuit board LED unit according to selected embodiments of the current disclosure.

FIG. 15 is a top view of a housing of a printed circuit board LED unit according to selected embodiments of the current disclosure.

FIG. 16 is a perspective view of a printed circuit board with LEDs affixed thereto according to selected embodiments of the current disclosure.

FIG. 17 is a cutaway side view of a printed circuit board LED unit according to selected embodiments of the current disclosure.

DETAILED DESCRIPTION OF THE INVENTION

Many aspects of the invention can be better understood with the references made to the drawings below. The components in the drawings are not necessarily drawn to scale. Instead, emphasis is placed upon clearly illustrating the components of the present invention. Moreover, like reference numerals designate corresponding parts through the several views in the drawings.

FIG. 1 is a top schematic view of a single-chip fluid-cooled LED unit according to selected embodiments of the current disclosure. Fluid 90 travels through a conduit 30 that is in physical contact with both a plastic bezel 41 and a mount plate 20. The fluid 90 enters through one opening 31 of the conduit 30, flows through the conduit 30, and then out another opening 31 of the conduit. An LED chip 50 is connected to two LED contact plates 51, where the contact plates 51 and LED chip 50 are affixed to the plastic bezel 41. A plastic lens 40 surrounds and protects the LED chip 50. A power source is electrically connected to the contact plates 51 to provide electrical current to the LED chip 50, which emits light when powered.

FIG. 2 is a cutaway front view of a single-chip fluid-cooled LED unit according to selected embodiments of the current disclosure. The cutaway view of FIG. 2 is shown along broken line 2 of FIG. 1. FIG. 3 is a cutaway side view of a single-chip fluid-cooled LED unit according to selected embodiments of the current disclosure. The cutaway view of FIG. 3 is shown along broken line 3 of FIG. 1. Portions of the conduit 30 are integrated into the plastic bezel 41. The LED contact plates 51 are also integrated into the plastic bezel 41, where portions of the LED contact plates 51 extend beyond the bezel to allow for electrical connections thereto. The LED chip 50 is mounted onto the plastic bezel 41 and is surrounded by a plastic lens 40. The plastic bezel and portions of the bottom of conduit 30 are also adjacent to the mount plate 20. In fact, the plastic bezel 41 is affixed to the mount plate 20.

When in use, heat generated by the LED chip 50 is transferred to the plastic bezel 41 and the plastic lens 40. This heat is then transferred to the fluid 90 travelling through the conduit 30. Heat from the mount plate 20 may also be transferred to the fluid 90. In this manner, the fluid quickly and efficiently removes heat generated by the LED unit.

FIG. 4 is a top perspective view of a single-chip fluid-cooled LED unit according to selected embodiments of the current disclosure. LED contact plates 51 extend out of the plastic bezel 41 to provide contact points for an external power source. The plastic lens 40 surrounds the LED chip (not shown in this figure). The plastic bezel 41 is affixed to a mount plate 20. Conduit 30 passes through the plastic bezel 41, wherein fluid travels therethrough by entering and exiting through the openings 31.

FIG. 5 is an exploded view of a single-chip fluid-cooled LED unit according to selected embodiments of the current disclosure. The mount plate 20 supports the conduit 30 and the plastic bezel 41. Fluid flows into one opening 31 of the conduit and exits out the other opening 31. The LED chip 50 is electrically connected to the LED contact plates 51, and the LED contact plates extend through the plastic bezel 41. The plastic lens 40 surrounds and protects the LED chip 50, both of which are also in physical contact with the plastic bezel 41. It is important to note the bend in the conduit 30. The openings 31 should be raised away from the mounting plate 20 to allow a connection to other tubing that transports fluid to and away from the LED unit. However, it is also beneficial to have the conduit adjacent to the mount plate 20. Therefore, a bend is implemented in the conduit to enable sufficient access to the openings 31, while still providing sufficient surface contact to transfer heat from the mount plate 20 to the fluid 90 via the conduit 30.

When manufacturing the LED unit shown in FIG. 5, the conduit and LED contact plates are held in place while the plastic bezel is formed. Preferably, the plastic bezel is made from silicon or epoxy material. The plastic material is poured into a mold that contains the conduit and LED contact plates and allowed to harden to create the plastic bezel. An LED chip is then electrically connected to the LED contact plates and affixed to the plastic bezel. A plastic lens is then formed around the LED chip, preferably in a similar fashion to the plastic bezel. At some point after the plastic bezel is formed, the plastic bezel is affixed to the mount plate.

FIG. 6 is a partial cutaway top view of a single-chip fluid-cooled LED unit according to selected embodiments of the current disclosure. A substantial portion of the bezel is removed, as well as the top part of the conduit, to gain a better perspective of the arrangement and configuration of the LED unit.

FIG. 7 is a top schematic view of a multi-chip fluid-cooled LED unit according to selected embodiments of the current disclosure. In this iteration, the plastic bezel 41 includes a hole in which the conduit 30, LED chips 50, and plastic lens 40 reside. LED contact plates 51 are partially contained within the plastic bezel 41. One end of each contact plate 51 extends beyond the edge of the plastic bezel 41. Two ends of the conduit 30 also extend through the plastic bezel 41. Fluid 90 enters one opening 31 of the conduit 30, travels through the conduit 30, and exits the other opening 31.

FIG. 8 is a cutaway side view of a multi-chip fluid-cooled LED unit according to selected embodiments of the current disclosure. The cutaway view of FIG. 8 is shown along broken line 8 of FIG. 7. The conduit 30 is in contact with the mount plate 20, plastic bezel 41, and plastic lens 40. The conduit 30 includes a bend that shifts the conduit 30 away from the mount plate 20. This allows other conduit to engage and mate with the openings to transfer fluid therethrough.

FIG. 9 is a front view of a multi-chip fluid-cooled LED unit according to selected embodiments of the current disclosure. The cutaway view of FIG. 9 is shown along broken line 9 of FIG. 7. Each LED unit includes a plurality of LED chips. The LED chips are located adjacent to the mount plate 20 and are surrounded by the plastic lens 40.

FIG. 10 is a top perspective view of a multi-chip fluid-cooled LED unit according to selected embodiments of the current disclosure. The lens 40 is surrounded by the plastic bezel 41 on all four sides. The conduit 30 has two openings 31 that extend out from the plastic bezel 41. An electrical power source is connected to the LED contact plates 51, thereby providing electrical power to the LED chips (not shown in this figure).

FIG. 11 is an exploded view of a multi-chip fluid-cooled LED unit according to selected embodiments of the current disclosure. LED contact plates 51 are electrically connected to LEDs 50. In this embodiment, two sets of four LEDs in series are wired to the LED contact plates 51. These LEDs are surrounded and protected by the plastic lens 40. Conduit 30 wraps around the plastic lens and allows heat to transfer from the LEDs 50, to the plastic lens 40, and to the fluid travelling through the conduit 30. Additionally, heat flows from the LED chips 50 to the mount plate 20, and then to the fluid travelling through the conduit 30. The plastic bezel 41 encloses the LED lens 40 and conduit 30, wherein portions of the conduit extend through the plastic bezel 41 to provide access to openings 31 of the conduit 30.

A particular method of manufacturing the LED unit known to the inventor includes first mounting the LEDs 50 to the mount plate 20. LED contact plates 51 and conduit 30 are integrated into the plastic bezel 41, which is then mounted to the mount plate 20. The LED contact plates 51 are then electrically connected to the LEDs 50. What remains is a cavity bounded by the plastic bezel 41, conduit 31, and mount plate 20 with mounted LEDs 50. Finally, a silicon or epoxy resin is poured into the cavity and allowed to harden to form the plastic lens 40.

FIG. 12 is a partial cutaway top view of a multi-chip fluid-cooled LED unit according to selected embodiments of the current disclosure. A substantial portion of the bezel and LED lens is removed, as well as the top part of the conduit, to gain a better perspective of the arrangement and configuration of the LED unit. Fluid flows into one opening 31, through conduit 30, and out the other opening 31. Heat produced by LEDs 50 is transferred to the plastic lens 40 and to the mount plate 20. Heat from the plastic lens 50 and mount plate 20 is then transferred to conduit 30, which in turn is then transferred to the fluid flowing therethrough. LEDs 50 are powered by electricity flowing through LED contact plates 51.

FIG. 13 is an exploded view of a printed circuit board LED unit according to selected embodiments of the current disclosure. The LED unit 110 includes a mount plate 120. The mount plate 120 has a channel 121 extending therethrough. An inlet 128 and outlet 129 are used to provide fluid into and out of the channel 121 in the mounting plate 120. A printed circuit board 130 (shown in more detail in FIG. 16) has a plurality of raw LED chips 140 secured thereto. Screws 132 attach the printed circuit board 130 to the mount plate 120. A silicon seal 125 between the mount plate 120 and printed circuit board 130 provides a fluid tight seal such that fluid will flow through the channel 121 bounded by the mount plate 120 and printed circuit board 130. A plastic lens 122 then fills the remainder of the mount plate 120 and seals the raw LED chips 140 and printed circuit board 130.

FIG. 14 is a side view of a printed circuit board LED unit according to selected embodiments of the current disclosure. Fluid is provided to the LED unit 110 through the inlet 128 and then travels through the mount plate 120, and then exits through the outlet 129. A small portion of the plastic lens 122 is viewable.

FIG. 15 is a top view of a housing of a printed circuit board LED unit according to selected embodiments of the current disclosure. Fluid flow 111 is shown travelling through the channel 121 in the mount plate 120. The mount plate 120 may also include a groove 123 in which a silicon seal may reside.

FIG. 16 is a perspective view of a printed circuit board with LEDs affixed thereto according to selected embodiments of the current disclosure. Multiple raw LED chips 140 are affixed to the printed circuit board 130. Electrical components 137 and 138, such as resistors, current controls, and integrated circuits, may also be incorporated onto the printed circuit board 130. A power source is connected to positive terminal 134 and negative terminal 135 to provide electrical power to the raw LED chips 140 and other electrical components 137 and 138.

FIG. 17 is a cutaway side view of a printed circuit board LED unit according to selected embodiments of the current disclosure. A fluid flows through a channel 121 that is bounded by the mount plate 120 and printed circuit board 130. Heat produced by the raw LED chips 130 is transferred to the printed circuit board 130, which in turn transfers heat to the fluid flowing through the channel 121 in the mount plate 120.

A single LED light unit, or element, according to the current invention can have a single raw LED chip, or hundreds if not thousands of raw LED chips on a printed circuit board. The printed circuit board can be of various shapes, though it must match the mount plate, described in more detail below. The printed circuit board has a wire design to run the LED at a voltage required for the specific application, such as 3, 6, 9, 12, 15, 18, 25, 110 Volts, or higher. The LEDs can be configured in series, parallel, or a combination thereof to reach the required voltage and lighting specifications.

The printed circuit board, once designed, is laminated onto a metal back plate, ceramic back plate, thermoplastic back plate, or any other suitable material. Positive and negative terminals are also incorporated into the printed circuit board to provide connections for a power source.

As stated above, the raw LED chips are bonded directly onto the printed circuit board. Each chip is then wire bonded onto the positive location and then to the negative location on the printed circuit board to create continuity such that when power is supplied to the positive and negative terminals of the printed circuit board, the LED chips are powered and emit light. As will be appreciated, the number and placement of the LED chips will vary with the particular application of the LED lighting unit.

The printed circuit board will also have a location where resistors, current controls, and other electronics can be bonded onto and be able to drive the LED chips at a desired current and voltage. Furthermore, different types of raw LED chips may be used on the same circuit board, such LEDs that emit different colors of light. For example, a printed circuit board according to the current invention will have red LED chips, green LED chips, and blue LED chips bonded thereto along with an integrated circuit to control the different color LEDs. The integrated circuit can cause all, some, or none of the LEDs to light up, as well as cause some of the to turn on and off at a set rate to create a flashing light. The combinations are nearly limitless, as the integrated circuit can be manufactured for a particular desired application. Along this same line, the integrated circuit can be designed to provide a dimmable lighting unit, whereby the intensity of the light emitted or the number of powered LED chips can be varied. A photocell or photoresistor may be incorporated as well to provided a self-contained light that turns on and off dependent upon incident light. Wireless communication components, such as a Wi-Fi™ network interface, connected to the printed circuit board are used to access and control the lighting unit, whereby the features of the lighting are controlled by a personal computer.

In a particular embodiment, a filter or colored translucent plastic or glass is placed right above the raw LED chip that is bonded onto the printed circuit board to make appropriate adjustments of color. In this manner, the color and consistency of the light emitted from the LED unit may be modified.

A plastic lens covers and protects the raw LED chips, printed circuit board, and other electronic components of the LED lighting unit. A silicon or epoxy material is used to create the plastic lens, and can be colored and/or clouded to provide different lighting effects.

The mount plate is a cast molded or formed body with an appropriate shape to accept and mate with the printed circuit board to which the raw LED chips are attached. A cavity in the mount plate provides a suitable housing for the printed circuit board, with an outer edge that extends above the top of the printed circuit board so as to create a mold for the plastic lens. For larger units, the mount plate may have an area on the back side to house a battery, whereby the battery powers the printed circuit board (and thus the LEDs). Such a battery may optionally be encapsulated with the same material used for the plastic lens to create a complete, solid, water and explosion resistant LED lighting unit. The back side may also include mounting holes such that the entire lighting unit may be mounted to a wall, light box, or other surface.

As will be appreciated, the mount plate may be any shape that is required and made through casting or another suitable manufacturing method. The body of the mount plate can be made from metal, ceramic, or even plastic materials. In a particular embodiment, the inlet and outlet are cast as one body with the mount plate. In addition to channels for fluid to flow through, there is also a groove or opening for a silicon seal to reside, where the silicon seal provides a fluid tight connection between the mount plate and the back side of the printed circuit board.

Once the main components of the lighting unit are ready, including the mount plate, silicon seal, printed circuit board with raw LED chips and other electrical components, these items must be combined together. A silicon seal is placed into an appropriate opening in the mount plate (if available), and the printed circuit board is placed into a cavity in the mount plate, thereby sandwiching the silicon seal between the printed circuit board and the mount plate. A plurality of screws are used to secure the printed circuit board to the mount plate. Liquid epoxy or silicon resin is then injected into the mount plate, where sides of the mount plate contain the liquid epoxy or silicon. The liquid epoxy or silicon fills to the top of the mount plate and encapsulates the top of the printed circuit board, raw LED chips, and other electrical components affixed to the printed circuit board. The lighting unit is then allowed to cure so that the plastic lens may harden. The resulting lighting unit is substantially sealed and resistant to the elements, whereby the only protruding electrical components are the electrical leads to connect to a power supply and the inlet and outlet ports to connect to a fluid supply. Note that if a battery unit is included, the electrical leads may be encapsulated as well.

To use the lighting unit according to the current invention, the electrical contacts are connected to a power source and the inlet is connected to a fluid source. The electrical power causes the LEDs to emit light. At the same time, fluid flows in through the inlet, and through a channel in the mount plate that is also bounded by the back side of the printed circuit board. The fluid then flows through the outlet. As the LEDs emit light, heat is generated. This heat, if not removed or otherwise dissipated will cause the junction temperature of the LEDs to rise, thereby reducing the light emitted, consuming greater amounts of electricity, and overall decreasing the life of each raw LED chip. In the lighting element of the current invention, heat from the LED chips is transferred to the printed circuit board and the surrounding plastic lens. Heat from the plastic lens is also transferred to the printed circuit board. Since the fluid travelling through the channels in the mount plate comes in contact with the printed circuit board, heat is transferred from the printed circuit board to the fluid. The fluid with the increased heat then exits through the outlet while new, cooler fluid enters through the inlet. In this fashion, heat is dissipated from the lighting unit and the junction temperature of the LEDs is reduced. Cooler junction temperatures result in LED chips that last longer, run brighter, and use less electricity. Multiple light units may be connected together, wherein fluid that flows out from one unit flows into the inlet of another unit.

The LED lighting unit according to the current invention eliminates the need to place a finished LED onto a printed circuit board, allows for more chips unit area than previously possible, and has a longer life than non-fluid cooled LED lighting units.

In a particular embodiment, the fluid is water. Water is a readily available fluid source in many locations, and is easily disposed of when no longer needed. The mount plate is preferably composed of a dielectric material. The plastic lens and plastic bezel are preferably composed of silicon or epoxy material. The LED conductive plates are preferably composed of a conductive material, such as copper or other metals.

It should be understood that while the preferred embodiments of the invention are described in some detail herein, the present disclosure is made by way of example only and that variations and changes thereto are possible without departing from the subject matter coming within the scope of the following claims, and a reasonable equivalency thereof, which claims I regard as my invention.

That which is claimed:

1. A device comprising
a mount plate, a printed circuit board, a seal, and a lens,
where the mount plate comprises a channel extending therethrough and a groove, where the seal resides within the groove,
where the printed circuit board comprises a raw light emitting diode,
where the printed circuit board is secured to the mount plate thereby enclosing the channel of the mount plate,
where the lens covers the printed circuit board,
whereby fluid travelling through the channel comes in contact with the printed circuit board, whereby heat emitted from the raw light emitting diode is transferred to the printed circuit board and then to the fluid travelling through the channel, and whereby the seal creates a fluid tight seal between the printed circuit board and the mount plate.

2. The device of claim 1, wherein the mount plate further comprises an inlet and an outlet, whereby fluid is supplied to the channel in the mount plate via the inlet, whereby fluid exits the mount plate via the outlet.

3. The device of claim 1, wherein the printed circuit board further comprises one or more electrical components selected from the group consisting of resistors, current controls, and integrated circuits.

4. The device of claim 1, wherein the printed circuit board further comprises a positive terminal and a negative terminal, whereby power is supplied to the printed circuit board through the positive and negative terminal.

5. The device of claim 1, further comprising a plurality of screws, wherein the screws secure the printed circuit board to the mount plate.

6. The device of claim 1, wherein the lens is made from a material selected from the group consisting of epoxy and silicon.

7. The device of claim 1, wherein the printed circuit board further comprises a plurality of additional raw light emitting diodes.

8. A method of operating a light emitting diode comprising the steps of obtaining a lighting unit, where the lighting unit comprises a mount plate, a printed circuit board, a lens, a seal, and a light emitting diode, where the mount plate comprises a channel extending therethrough, a groove, an inlet, and an outlet, where the seal resides within the groove, where the inlet and outlet of the mount plate are in fluid connection with the channel of the mount plate, where the printed circuit board comprises positive and negative terminals, where the light emitting diode is secured to and in electrical connection with the printed circuit board, where the printed circuit board is secured to the mount plate thereby enclosing the channel of the mount plate, where the lens covers the printed circuit board and light emitting diode, where the seal creates a fluid tight seal between the printed circuit board and the mount plate;

providing power to the positive and negative terminals of the printed circuit board from a power source, whereby the power drives the light emitting diode causing it to emit light; and providing fluid to the inlet of the mount plate, whereby fluid flows through the channel of the mount plate and comes in contact with the printed circuit board, whereby heat emitted from the raw light emitting diode is transferred to the printed circuit board and then to the fluid travelling through the channel, whereby fluid exits through the outlet of the mount plate.

9. The method of claim 8, wherein the printed circuit board further comprises one or more electrical components selected from the group consisting of resistors, current controls, and integrated circuits.

10. The method of claim 8, wherein the lighting unit further comprises a plurality of screws, wherein the screws secure the printed circuit board to the mount plate.

11. The method of claim 8, wherein the lens is made from a material selected from the group consisting of epoxy and silicon.

12. The method of claim 8, wherein the printed circuit board further comprises a plurality of additional raw light emitting diodes.

* * * * *